United States Patent
Khlat

(10) Patent No.: US 11,431,316 B2
(45) Date of Patent: Aug. 30, 2022

(54) ACOUSTIC RESONATOR STRUCTURE

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 720 days.

(21) Appl. No.: 16/356,279

(22) Filed: Mar. 18, 2019

(65) Prior Publication Data

US 2020/0099360 A1 Mar. 26, 2020

Related U.S. Application Data

(60) Provisional application No. 62/733,700, filed on Sep. 20, 2018.

(51) Int. Cl.
*H03H 9/02* (2006.01)
*H03H 9/13* (2006.01)
*H03H 9/205* (2006.01)

(52) U.S. Cl.
CPC .......... *H03H 9/02125* (2013.01); *H03H 9/13* (2013.01); *H03H 9/205* (2013.01)

(58) Field of Classification Search
CPC ....... H03H 9/02125; H03H 9/13; H03H 9/205
See application file for complete search history.

(56) References Cited

U.S. PATENT DOCUMENTS

| | | | |
|---|---|---|---|
| 6,246,153 B1 | 6/2001 | Bishop et al. | |
| 6,671,016 B1 | 12/2003 | Kim | |
| 7,333,831 B2 | 2/2008 | Srinivasan et al. | |
| 7,459,990 B2 | 12/2008 | Wunnicke et al. | |
| 7,515,018 B2 | 4/2009 | Handtmann et al. | |
| 8,026,776 B2 | 9/2011 | Ueda et al. | |
| 9,698,752 B2 | 7/2017 | Burgener et al. | |
| 9,985,605 B2 | 5/2018 | Tani et al. | |
| 10,284,174 B2 | 5/2019 | Khlat et al. | |
| 2008/0055020 A1 | 3/2008 | Handtmann et al. | |
| 2009/0273415 A1 | 11/2009 | Frank et al. | |
| 2016/0191016 A1* | 6/2016 | Khlat ...................... | H04B 1/04 455/129 |

(Continued)

OTHER PUBLICATIONS

Notice of Allowance for U.S. Appl. No. 16/387,940, dated Jan. 21, 2020, 7 pages.

(Continued)

*Primary Examiner* — Jeffrey M Shin
(74) *Attorney, Agent, or Firm* — Withrow & Terranova, P.L.L.C.

(57) ABSTRACT

An acoustic resonator structure is provided. The acoustic resonator structure includes an acoustic resonator configured to resonate in a first frequency to pass a radio frequency (RF) signal. However, the acoustic resonator may create an electrical capacitance outside the first frequency, which can cause the acoustic resonator to resonate at a second frequency in parallel to the first frequency, thus compromising performance of the acoustic resonator. In this regard, a passive acoustic circuit is provided in parallel to the acoustic resonator in the acoustic resonator structure. The passive acoustic circuit can be configured to resonate in the second frequency to cancel the electrical capacitance created by the acoustic resonator. As such, it may be possible to improve performance of the acoustic resonator without significantly increasing complexity and footprint of the acoustic resonator structure.

20 Claims, 7 Drawing Sheets

(56) References Cited

U.S. PATENT DOCUMENTS

| | | | |
|---|---|---|---|
| 2017/0093370 | A1 | 3/2017 | Khlat et al. |
| 2017/0201233 | A1* | 7/2017 | Khlat .................. H03H 9/542 |
| 2018/0019731 | A1 | 1/2018 | Tsukamoto et al. |
| 2019/0181834 | A1 | 6/2019 | Bauder et al. |
| 2020/0099362 | A1 | 3/2020 | Khlat |
| 2020/0099363 | A1 | 3/2020 | Khlat |
| 2020/0099364 | A1 | 3/2020 | Khlat |

OTHER PUBLICATIONS

Non-Final Office Action for U.S. Appl. No. 16/358,913, dated May 7, 2020, 9 pages.

Non-Final Office Action for U.S. Appl. No. 16/358,913, dated Jun. 9, 2020, 6 pages.

Karasawa, Rei, et al., "c-Axis zig-zag polarization inverted ScAIN multilayer for FBAR transformer rectifying antenna," IEEE International Ultrasonics Symposium, 2017, Washington, DC, 4 pages.

Larson, John, et al., "Characterization of reversed c-axis AIN thin films," IEEE International Ultrasonics Symposium, San Diego, California, 2010, pp. 1054-1059.

Sussman-Fort, Stephen, "Matching Network Design Using Non-Foster Impedances," Antenna Products and Technologies, EDO Electronic Systems Group, ieee.li/pdf/viewgraphs/matching_network_design_non_foster_impedances, accessed Sep. 10, 2018, Bohemia, New York, 43 pages.

Final Office Action for U.S. Appl. No. 16/358,913, dated Sep. 28, 2020, 11 pages.

Notice of Allowance for U.S. Appl. No. 16/358,913, dated Dec. 3, 2020, 7 pages.

Notice of Allowance for U.S. Appl. No. 16/358,913, dated Nov. 16, 2020, 7 pages.

Non-Final Office Action for U.S. Appl. No. 16/387,940, dated Sep. 26, 2019, 10 pages.

Non-Final Office Action for U.S. Appl. No. 16/385,301, dated Apr. 6, 2022, 14 pages.

* cited by examiner

ACOUSTIC RESONATOR STRUCTURE

RELATED APPLICATIONS

This application claims the benefit of U.S. provisional patent application Ser. No. 62/733,700, filed on Sep. 20, 2018, the disclosure of which is incorporated herein by reference in its entirety.

FIELD OF THE DISCLOSURE

The technology of the disclosure relates generally to an acoustic resonator(s)/filter(s).

BACKGROUND

Wireless devices have become increasingly common in current society. The prevalence of these wireless devices is driven in part by the many functions that are now enabled on such devices for supporting a variety of applications. In this regard, a wireless device may employ a variety of circuits and/or components (e.g., filters, transceivers, antennas, and so on) to support different numbers and/or types of applications. Accordingly, the wireless device may include a number of switches to enable dynamic and flexible couplings between the variety of circuits and/or components.

Acoustic resonators, such as Surface Acoustic Wave (SAW) resonators and bulk acoustic wave (BAW) resonators, are used in many high-frequency communication applications. In particular, SAW resonators are often employed in filter networks that operate frequencies up to 1.8 GHz, and BAW resonators are often employed in filter networks that operate at frequencies above 1.5 GHz. Such filters need to have flat passbands, have steep filter skirts and squared shoulders at the upper and lower ends of the passband, and provide excellent rejection outside of the passband. SAW and BAW-based filters also have relatively low insertion loss, tend to decrease in size as the frequency of operation increases, and are relatively stable over wide temperature ranges.

As such, SAW and BAW-based filters are the filter of choice for many 3rd Generation (3G) and 4th Generation (4G) wireless devices and are destined to dominate filter applications for 5th Generation (5G) wireless devices. Most of these wireless devices support cellular, wireless fidelity (Wi-Fi), Bluetooth, and/or near field communications on the same wireless device and, as such, pose extremely challenging filtering demands. While these demands keep raising the complexity of wireless devices, there is a constant need to improve the performance of acoustic resonators and filters that are based thereon.

SUMMARY

Aspects disclosed in the detailed description include an acoustic resonator structure. The acoustic resonator structure includes an acoustic resonator configured to resonate in a first frequency to pass a radio frequency (RF) signal. However, the acoustic resonator may create an electrical capacitance outside the first frequency, which can cause the acoustic resonator to resonate at a second frequency in parallel to the first frequency, thus compromising performance of the acoustic resonator. In this regard, a passive acoustic circuit is provided in parallel to the acoustic resonator in the acoustic resonator structure. The passive acoustic circuit can be configured to resonate in the second frequency to cancel the electrical capacitance created by the acoustic resonator. As such, it may be possible to improve performance of the acoustic resonator without significantly increasing complexity and footprint of the acoustic resonator structure.

In one aspect, an acoustic resonator structure is provided. The acoustic resonator structure includes an input node and an output node. The acoustic resonator structure also includes an acoustic resonator coupled between the input node and the output node. The acoustic resonator is configured to resonate in a first frequency to pass an RF signal from the input node to the output node. The acoustic resonator also causes an electrical capacitance between the input node and the output node at a second frequency different from the first frequency. The acoustic resonator structure also includes a passive acoustic circuit coupled in parallel to the acoustic resonator. The passive acoustic circuit is configured to resonate in the second frequency to cancel the electrical capacitance.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
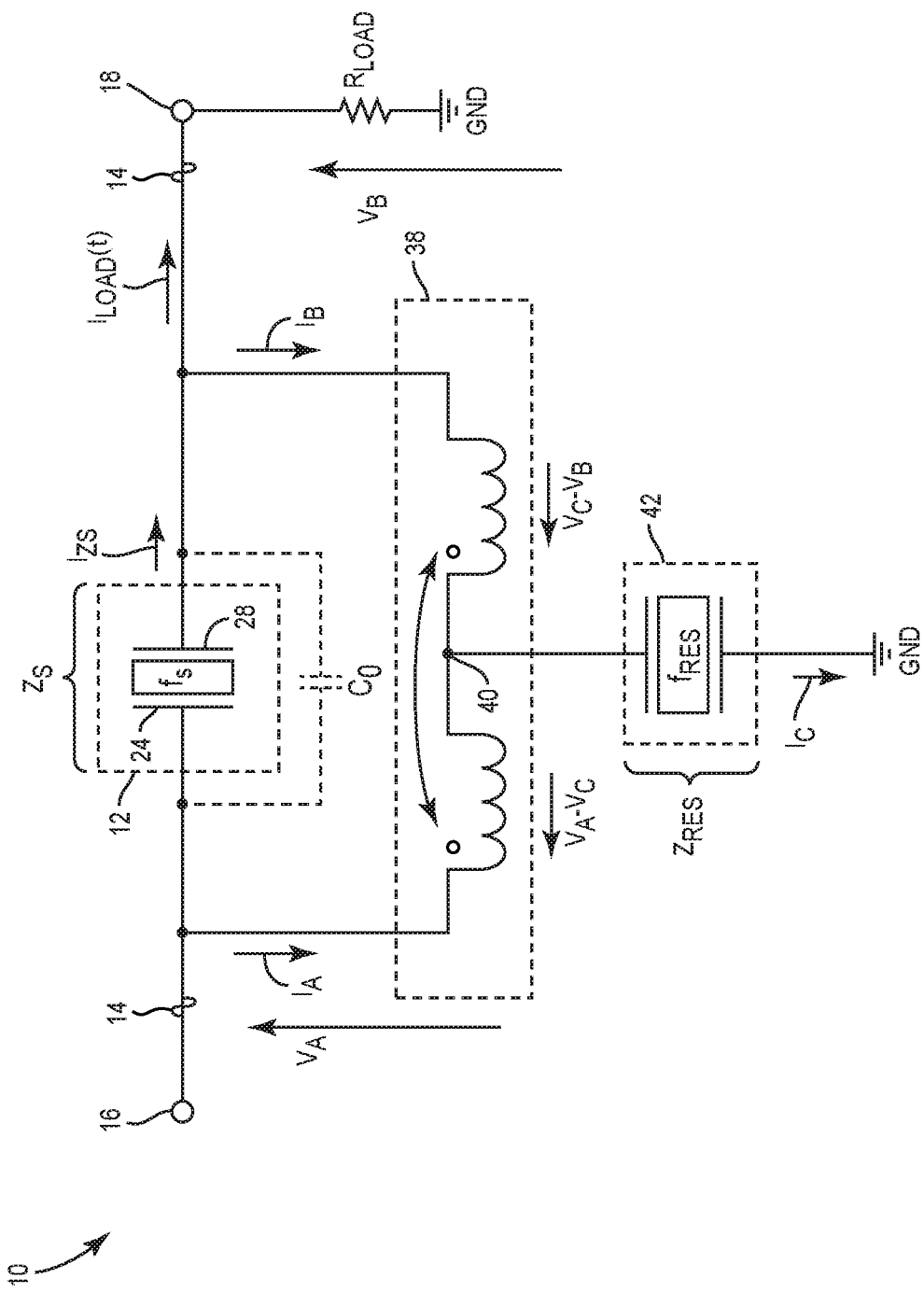
FIG. 1A is a schematic diagram of an exemplary existing acoustic resonator structure, which can have a relatively larger footprint.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an acoustic resonator structure. The acoustic resonator structure includes an acoustic resonator configured to resonate in a first frequency to pass a radio frequency (RF) signal. However, the acoustic resonator may create an electrical capacitance outside the first frequency, which can cause the acoustic resonator to resonate at a second frequency in parallel to the first frequency, thus compromising performance of the acoustic resonator. In this regard, a passive acoustic circuit is provided in parallel to the acoustic resonator in the acoustic resonator structure. The passive acoustic circuit can be configured to resonate in the second frequency to cancel the electrical capacitance created by the acoustic resonator. As such, it may be possible to improve performance of the acoustic resonator without significantly increasing complexity and footprint of the acoustic resonator structure.

Figure 1B:
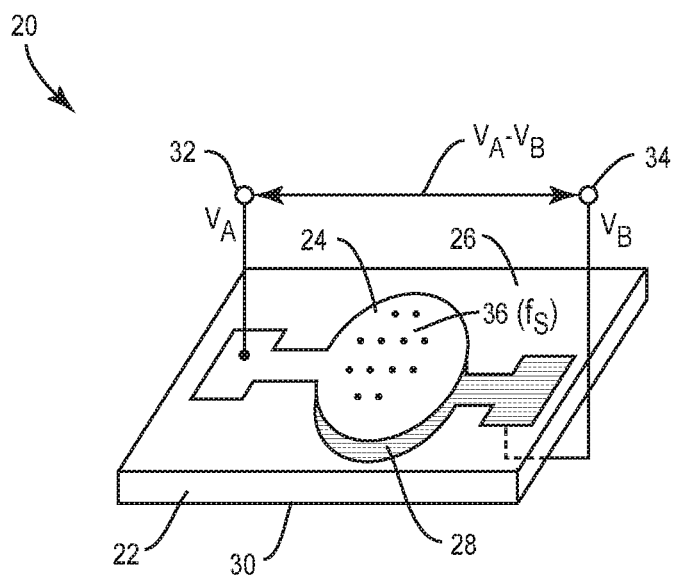
FIG. 1B is a schematic diagram of an exemplary bulk acoustic wave (BAW) resonator, which can be provided in the existing acoustic resonator structure of FIG. 1A.

Before discussing an acoustic resonator structure of the present disclosure, a brief overview of an existing acoustic resonator structure configured to cancel an electrical capacitance created by an acoustic resonator is first provided with reference to FIGS. 1A and 1B. The discussion of specific exemplary aspects of the acoustic resonator structure of the present disclosure starts below with reference to FIG. 2.

In this regard, FIG. 1A is a schematic diagram of an exemplary existing acoustic resonator structure 10, which can have a relatively larger footprint. The existing acoustic resonator structure 10 includes an acoustic resonator 12, which is configured to resonate in a first frequency ($f_S$). In this regard, the acoustic resonator 12 may function as an acoustic filter to pass an RF signal 14 from an input node 16 to an output node 18 in the first frequency ($f_S$) and reject the RF signal 14 in a second frequency ($f_{RES}$) that is outside a defined bandwidth of the first frequency ($f_S$).

In a non-limiting example, the acoustic resonator can be a bulk acoustic wave (BAW) resonator, as illustrated in FIG. 1B. FIG. 1B is a schematic diagram of an exemplary BAW resonator 20, which can be provided as the acoustic resonator 12 in the existing acoustic resonator structure 10 of FIG. 1A. Common elements between FIGS. 1A and 1B are shown therein with common element numbers and will not be re-described herein.

The BAW resonator 20 includes a piezo layer 22 (e.g., a quartz crystal), a top metal electrode 24 disposed on a top surface 26 of the piezo layer 22, and a bottom metal electrode 28 disposed on a bottom surface 30 of the piezo layer 22. When a first voltage $V_A$ and a second voltage $V_B$ are applied to a top electrical port 32 and a bottom electrical port 34, respectively, an acoustic wave 36 is excited and resonates in the first frequency ($f_S$) between the top surface 26 and the bottom surface 30 of the piezo layer 22. The first frequency ($f_S$) may be determined by a thickness of the piezo layer 22 as well as a mass of the top metal electrode 24 and the bottom metal electrode 28.

With reference back to FIG. 1A, the existing acoustic resonator structure 10 may be coupled to a load $R_{LOAD}$ between the output node 18 and a ground (GND). When the acoustic resonator 12 resonates in the first frequency ($f_S$), the acoustic resonator 12 functions as a short circuit. Accordingly, the RF signal 14 can propagate from the input node 16 to the output node 18 with little resistance. However, outside the first frequency ($f_S$), the top metal electrode 24 and the bottom metal electrode 28 in the acoustic resonator 12 can present an electrical capacitance $C_0$ in parallel to the acoustic resonator 12. The electrical capacitance $C_0$ may be determined based on equation (Eq. 1) below.

$$C_0 = I_{LOAD}(t) \bigg/ \left(\frac{dV(t)}{dt}\right) \quad \text{(Eq. 1)}$$

In the equation (Eq. 1) above, $I_{LOAD}(t)$ represents a time-variant load current flowing through the load $R_{LOAD}$ and $dV(t)/dt$ represents time-variant voltage applied across the acoustic resonator 12. Notably, the electrical capacitance $C_0$ can cause the acoustic resonator 12 to resonate at the second frequency ($f_{RES}$), thus resulting in parallel resonance in the acoustic resonator 12. Consequently, the acoustic resonator 12 may not be able to effectively reject the RF signal 14 in the second frequency ($f_{RES}$), thus compromising performance of the acoustic resonator 12. As such, it may be desired to eliminate the electrical capacitance $C_0$ presented by the acoustic resonator 12. According to the equation (Eq. 1) above, the electrical capacitance $C_0$ is proportionally related to the time-variant load current $I_{LOAD}(t)$. As such, it may be possible to eliminate the electrical capacitance $C_0$ by eliminating the time-variant load current $I_{LOAD}(t)$.

In this regard, the existing acoustic resonator structure 10 includes an autotransformer 38 coupled between the input node 16 and the output node 18 in parallel to the acoustic resonator 12. The autotransformer 38 is configured to transform the first voltage $V_A$ and the second voltage $V_B$ into a shunt voltage $V_C$ at a tapping point 40. A first voltage differential between the first voltage $V_A$ and the shunt voltage $V_C$ can induce a first current $I_A$ between the input node 16 and the tapping point 40. Likewise, a second voltage differential between the shunt voltage $V_C$ and the second voltage $V_B$ can induce a second current $I_B$ between the output node 18 and the tapping point 40.

In a non-limiting example, the tapping point 40 is so configured to be in a center of the autotransformer 38. As such, a differential between the first voltage $V_A$ and the shunt voltage $V_C$ is approximately equal to a differential between the shunt voltage $V_C$ and the second voltage $V_B$ ($V_A - V_C \approx V_C - V_B$). Accordingly, the first current $I_A$ is approximately equal to the second current $I_B$ ($I_A \approx I_B$). The shunt voltage $V_C$ can be expressed in equation (Eq. 2) below.

$$(V_A - V_C) = (V_C - V_B) \rightarrow V_C = (V_A + V_B)/2 \quad \text{(Eq. 2)}$$

The existing acoustic resonator structure 10 also includes a shunt resonator 42 coupled between the tapping point 40 and the ground (GND). The shunt resonator 42 has a shunt impedance $Z_{RES}$, which can induce a shunt current $I_C$ based on the shunt voltage. In this regard, the shunt current $I_C$ can be seen as a sum of the first current $I_A$ and the second current $I_B$. The shunt resonator 42 may thus be configured to resonate in the second frequency ($f_{RES}$) to shunt the shunt current $I_C$ to the ground (GND). The shunt current $I_C$ can be expressed in equations (Eq. 3.1 and Eq. 3.2) below.

$$I_C = I_A + I_B \rightarrow I_A = I_B = I_C/2 \quad \text{(Eq. 3.1)}$$

$$I_C = V_C/Z_{RES} = (V_A + V_B)/(2 * Z_{RES}) \quad \text{(Eq. 3.2)}$$

Based on the equations (Eq. 3.1 and Eq. 3.2), the first current $I_A$ and the second current $I_B$ can be further expressed in equation (Eq. 4) below.

$$I_A = I_B = (V_A + V_B)/(4 * Z_{RES}) \quad \text{(Eq. 4)}$$

The acoustic resonator 12, on the other hand, has an inherent impedance $Z_S$. As such, the acoustic resonator 12 can induce an inherent current $I_{ZS}$ in response to the first voltage $V_A$ and the second voltage $V_B$ being applied to the input node 16 and the output node 18, respectively. Thus, the relationship between the time-variant load current $I_{LOAD}(t)$, the inherent current $I_{ZS}$, and the second current $I_B$ can be expressed in equations (Eq. 5.1-Eq. 5.3) below.

$$I_{LOAD}(t) = I_{ZS} - I_B \quad \text{(Eq. 5.1)}$$

$$I_{LOAD}(V_A - V_B)/Z_S - (V_A + V_B)/(4 * Z_{RES}) \quad \text{(Eq. 5.2)}$$

$$I_{LOAD}(t) = V_A * [1/Z_S - 1/(4 * Z_{RES})] - V_B * [1/Z_S + 1/(4 * Z_{RES})] \quad \text{(Eq. 5.3)}$$

As previously discussed, to eliminate the electrical capacitance $C_0$, it is necessary to eliminate the time-variant load current $I_{LOAD}(t)$. According to the equation (Eq. 5.3) above, the time-variant load current $I_{LOAD}(t)$ can be substantially equal to zero when the shunt impedance $Z_{RES}$ of the shunt resonator 42 is substantially equal to one-quarter (¼) of the inherent impedance $Z_S$ of the acoustic resonator 12 (e.g., $Z_{RES} = \frac{1}{4} Z_S \pm 0.01 \Omega$).

The existing acoustic resonator structure 10 may be able to effectively eliminate the time-variant load current $I_{LOAD}(t)$ thus eliminating the electrical capacitance $C_0$ created by the acoustic resonator 12. However, the autotransformer 38 can be bulky and cause the existing acoustic resonator structure 10 to demand the relatively larger footprint. As such, it may be desired to eliminate the electrical capacitance $C_0$ concurrent to reducing the footprint of the existing acoustic resonator structure 10.

Figure 2:
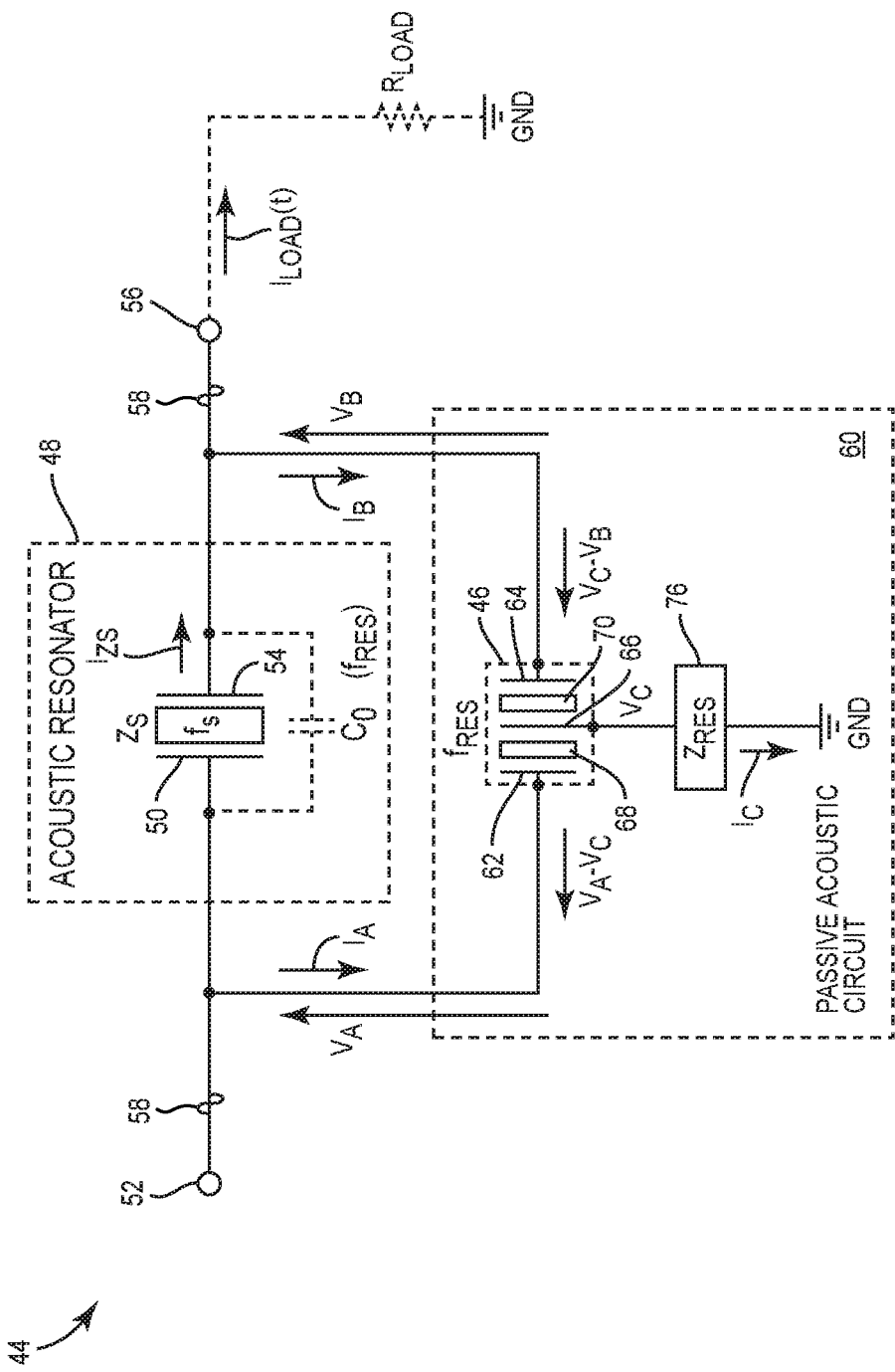
FIG. 2 is a schematic diagram of an exemplary acoustic resonator structure configured according to an embodiment of the present disclosure to reduce the footprint of the existing acoustic resonator structure of FIG. 1A.

In this regard, FIG. 2 is a schematic diagram of an exemplary acoustic resonator structure 44 configured according to an embodiment of the present disclosure to reduce the footprint of the existing acoustic resonator structure 10 of FIG. 1A. As discussed in detail below, the autotransformer 38 in the existing acoustic resonator structure 10 of FIG. 1A is replaced by an acoustic structure 46, which occupies a smaller footprint than the autotransformer 38, in the acoustic resonator structure 44. As a result, it may be possible to reduce the footprint of the acoustic resonator structure 44, thus allowing the acoustic resonator structure 44 to be provided in space constrained electronic devices (e.g., smartphones).

The acoustic resonator structure 44 includes an acoustic resonator 48 having a left electrode 50 coupled to an input node 52 and a right electrode 54 coupled to an output node 56. The acoustic resonator 48 may be functionally equivalent to the acoustic resonator 12 in FIG. 1A. In this regard, the acoustic resonator 48 is configured to resonate at a first frequency ($f_S$) to pass an RF signal 58 from the input node 52 to the output node 56 when a first voltage $V_A$ and a second voltage $V_B$ are applied to the left electrode 50 and the right electrode 54, respectively. Similar to the existing acoustic resonator structure 10 in FIG. 1A, the acoustic resonator 48 has an inherent impedance $Z_S$ and can induce an inherent current $I_{ZS}$ in response to the first voltage $V_A$ and the second voltage $V_B$ being applied to the left electrode 50 and the right electrode 54, respectively. Further, like the acoustic resonator 12, the left electrode 50 and the right electrode 54 of the acoustic resonator 48 may create an electrical capacitance $C_0$ in a second frequency ($f_{RES}$) that is different from the first frequency ($f_S$). As such, when the output node 56 is coupled to a load $R_{LOAD}$, the electrical capacitance $C_0$ can cause a time-variant load current $I_{LOAD}(t)$ in accordance to the equation (Eq. 1) above.

Figure 3:
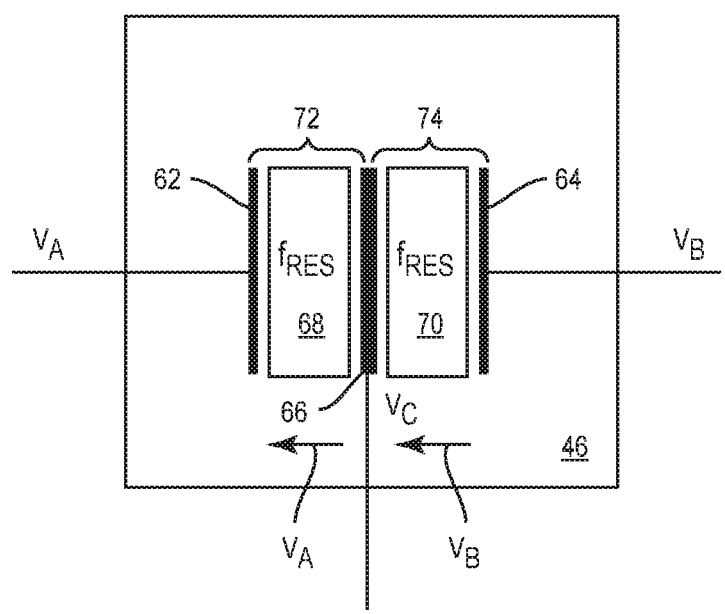
FIG. 3 is a schematic diagram providing an exemplary illustration of an acoustic structure in the acoustic resonator structure of FIG. 2.

To help cancel the electrical capacitance $C_0$, a passive acoustic circuit 60 is provided in parallel to the acoustic resonator 48 in the acoustic resonator structure 44. In a non-limiting example, the passive acoustic circuit 60 includes the acoustic structure 46 configured to resonate in the second frequency ($f_{RES}$). FIG. 3 is a schematic diagram providing an exemplary illustration of the acoustic structure 46 in the acoustic resonator structure 44 of FIG. 2. Common elements between FIGS. 2 and 3 are shown therein with common element numbers and will not be re-described herein.

The acoustic structure 46 includes a first electrode 62, a second electrode 64, and a third electrode 66. The third electrode 66 is sandwiched in between the first electrode 62 and the second electrode 64. The acoustic structure 46 includes a first piezo layer 68 provided between the first electrode 62 and the third electrode 66. The acoustic structure 46 also includes a second piezo layer 70 provided between the second electrode 64 and the third electrode 66. In a non-limiting example, the first piezo layer 68 and the second piezo layer 70 can be formed by quartz crystal. The thickness and/or mess of the first piezo layer 68 and the second piezo layer 70 may be so determined to cause the acoustic structure 46 to resonate in the second frequency ($f_{RES}$).

The first electrode 62, the first piezo layer 68, and the third electrode 66 may be seen as collectively forming a first BAW resonator 72. Likewise, the second electrode 64, the second piezo layer 70, and the third electrode 66 may be seen as collectively forming a second BAW resonator 74. In this regard, the acoustic structure 46 may be seen as being formed by stacking the first BAW resonator 72 with the second BAW resonator 74. Both the first BAW resonator 72 and the second BAW resonator 74 are configured to resonate in the second frequency ($f_{RES}$).

In one non-limiting example, the first electrode 62, the first piezo layer 68, and the third electrode 66 can form a polarized BAW resonator based on a c-type structure. In this regard, the first piezo layer 68 expands in response to the first voltage $V_A$ being a positive voltage and compresses in response to the first voltage $V_A$ being a negative voltage. In this non-limiting example, the second electrode 64, the second piezo layer 70, and the third electrode 66 can form a polarized inverted BAW resonator based on an f-type structure. In this regard, the second piezo layer 70 expands in response to the second voltage $V_B$ being a negative voltage and compresses in response to the second voltage $V_B$ being a positive voltage. Accordingly, the acoustic structure 46 outputs a third voltage $V_C$ (also referred to as a shunt voltage $V_C$) via the third electrode 66. The third voltage $V_C$ is related to the first voltage $V_A$ and the second voltage $V_B$ in accordance to the equation (Eq. 2) above.

In one non-limiting example, the first electrode 62, the first piezo layer 68, and the third electrode 66 can form a polarized inverted BAW resonator based on an f-type structure. In this regard, the first piezo layer 68 expands in response to the first voltage $V_A$ being a negative voltage and compresses in response to the first voltage $V_A$ being a positive voltage. In this non-limiting example, the second electrode 64, the second piezo layer 70, and the third electrode 66 can form a polarized BAW resonator based on a c-type structure. In this regard, the second piezo layer 70 expands in response to the second voltage $V_B$ being a positive voltage and compresses in response to the second voltage $V_B$ being a negative voltage. Accordingly, the acoustic structure 46 outputs a third voltage $V_C$ via the third electrode 66. The third voltage $V_C$ is related to the first voltage $V_A$ and the second voltage $V_B$ in accordance to the equation (Eq. 2) above.

With reference back to FIG. 2, the passive acoustic circuit 60 includes an impedance structure 76 configured to couple the third electrode 66 to a ground GND. The impedance structure 76 may be configured to include a capacitor(s), an inductor(s), an acoustic resonator(s), or a combination thereof. The impedance structure 76 has a shunt impedance ($Z_{RES}$), which can induce a shunt current IC based on the third voltage $V_C$, which is also referred to as a shunt voltage $V_C$ hereinafter.

A first voltage differential between the first voltage $V_A$ and the shunt voltage $V_C$ ($V_A$–$V_C$) can cause a first current $I_A$ to flow toward the first electrode 62. Likewise, a voltage differential between the shunt voltage $V_C$ and the second voltage $V_B$ ($V_C$–$V_B$) can cause a second current $I_B$ to flow toward the second electrode 64. The first current $I_A$, the second current $I_B$, and the shunt current $I_C$ are related to each other in accordance to the equations (Eq. 3.1, Eq. 3.2, and Eq. 4) above.

As previously discussed, to eliminate the electrical capacitance $C_0$, it is necessary to eliminate the time-variant load current $I_{LOAD}(t)$. According to the equation (Eq. 5.3) above, the time-variant load current $I_{LOAD}(t)$ can be substantially equal to zero when the shunt impedance $Z_{RES}$ of the impedance structure 76 is substantially equal to one-quarter (¼) of the inherent impedance $Z_S$ of the acoustic resonator 48 (e.g., $Z_{RES}=¼Z_S±0.01\Omega$).

Figure 4:
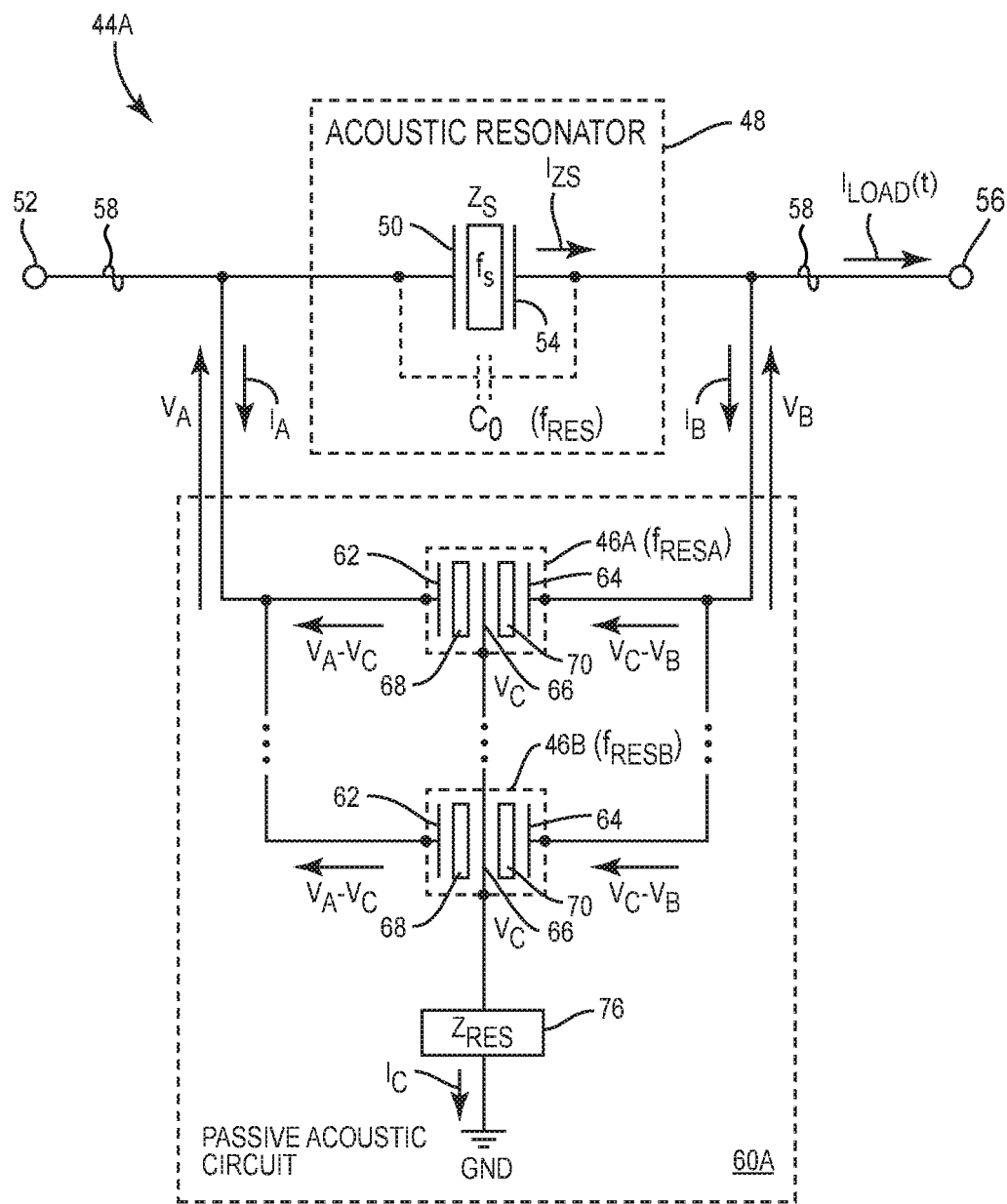
FIG. 4 is a schematic diagram of an exemplary acoustic resonator structure configured according to an embodiment of the present disclosure to cancel an electrical capacitance in more than one frequency.

Notably, the acoustic resonator 48 may create the electrical capacitance $C_0$ in more than one frequency outside the first frequency ($f_S$). As such, it may be necessary to include additional acoustic structures in the passive acoustic circuit 60. In this regard, FIG. 4 is a schematic diagram of an exemplary acoustic resonator structure 44A configured according to an embodiment of the present disclosure to cancel the electrical capacitance $C_0$ in more than one frequency outside the first frequency ($f_S$). Common elements between FIGS. 2 and 4 are shown therein with common element numbers and will not be re-described herein.

In a non-limiting example, the acoustic resonator 48 creates the electrical capacitance $C_0$ in a second frequency ($f_{RESA}$) and at least one third frequency ($f_{RESB}$). In this regard, the acoustic resonator structure 44A includes a first acoustic structure 46A and at least one second acoustic structure 46B. Each of the first acoustic structure 46A and the second acoustic structure 46B can be identical to the acoustic structure 46 in FIG. 3. The first acoustic structure 46A is configured to resonate in the second frequency ($f_{RESA}$) and the second acoustic structure 46B is configured to resonate in the third frequency ($f_{RESA}$). Accordingly, the passive acoustic circuit 60A may effectively cancel the electrical capacitance $C_0$ in both the second frequency ($f_{RESA}$) and the third frequency ($f_{RESB}$).

Figure 5:
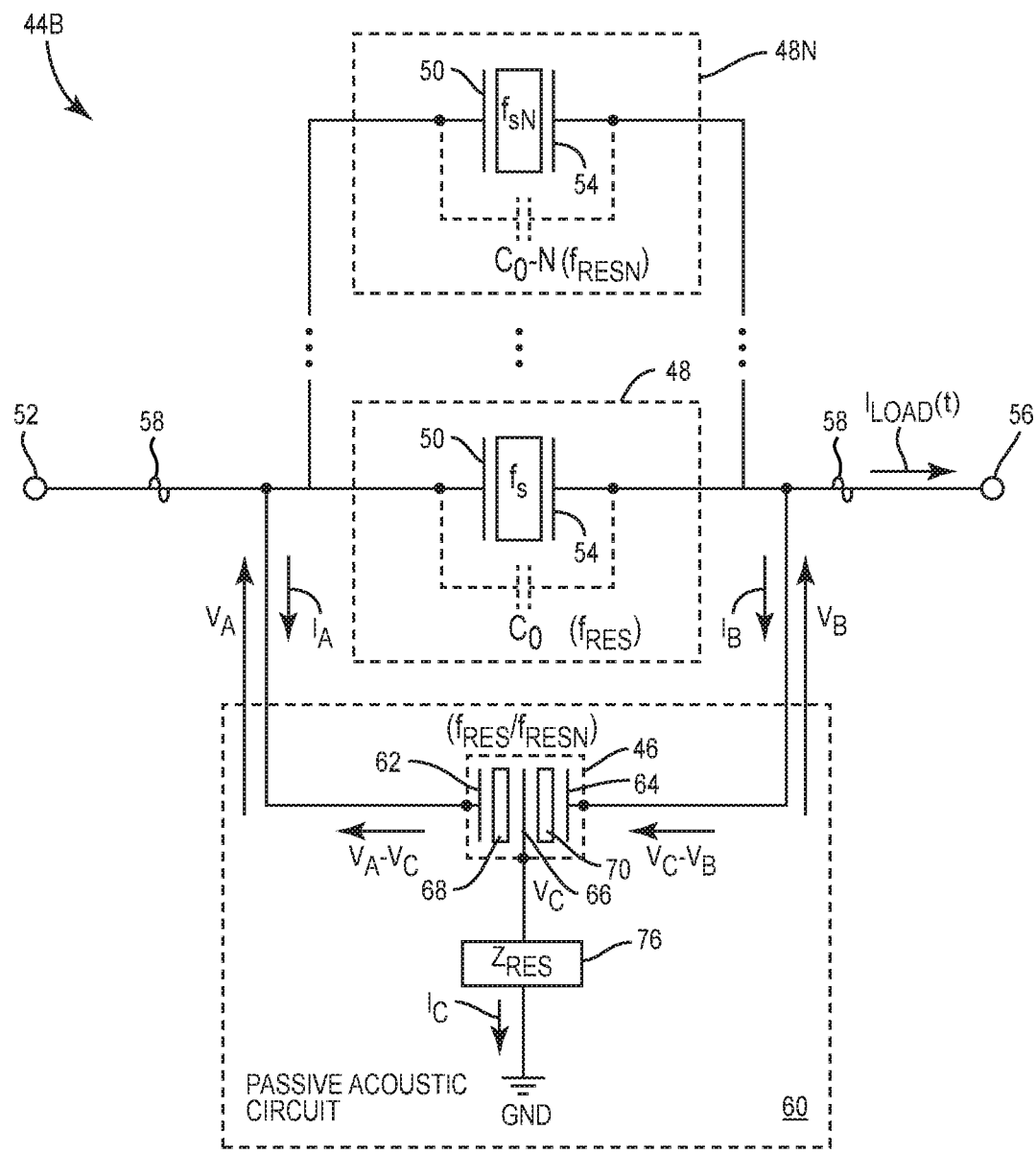
FIG. 5 is a schematic diagram of an exemplary acoustic resonator structure configured according to an embodiment of the present disclosure to cancel an electrical capacitance(s) caused by an acoustic resonator(s)

The acoustic resonator structure 44 of FIG. 2 may include more than one acoustic resonator to selectively pass the RF signal 58 in more than one frequency. Understandably, the more than one acoustic resonator may create more than one electrical capacitance $C_0$ that needs to be canceled. In this regard, FIG. 5 is a schematic diagram of an exemplary acoustic resonator structure 44B configured according to an embodiment of the present disclosure to cancel at least one electrical capacitance $C_0$ caused by more than one acoustic resonator. Common elements between FIGS. 2 and 5 are shown therein with common element numbers and will not be re-described herein.

The acoustic resonator structure 44B includes at least one second acoustic resonator 48N coupled in parallel to the acoustic resonator 48. The second acoustic resonator 48N is configured to resonate in at least one frequency ($f_{SN}$) to pass the RF signal 58 from the input node 52 to the output node 56. Like the acoustic resonator 48, the second acoustic resonator 48N can cause at least one second electrical capacitance $C_0$-N in at least one third frequency ($f_{RESN}$). The acoustic structure 46 may be configured to resonate in the second frequency ($f_{RES}$) and/or the third frequency ($f_{RESN}$). Accordingly, the passive acoustic circuit 60 may effectively cancel the electrical capacitance $C_0$ in the second frequency ($f_{RES}$) and/or the second electrical capacitance $C_0$-N in the third frequency ($f_{RESN}$).

Figure 6:
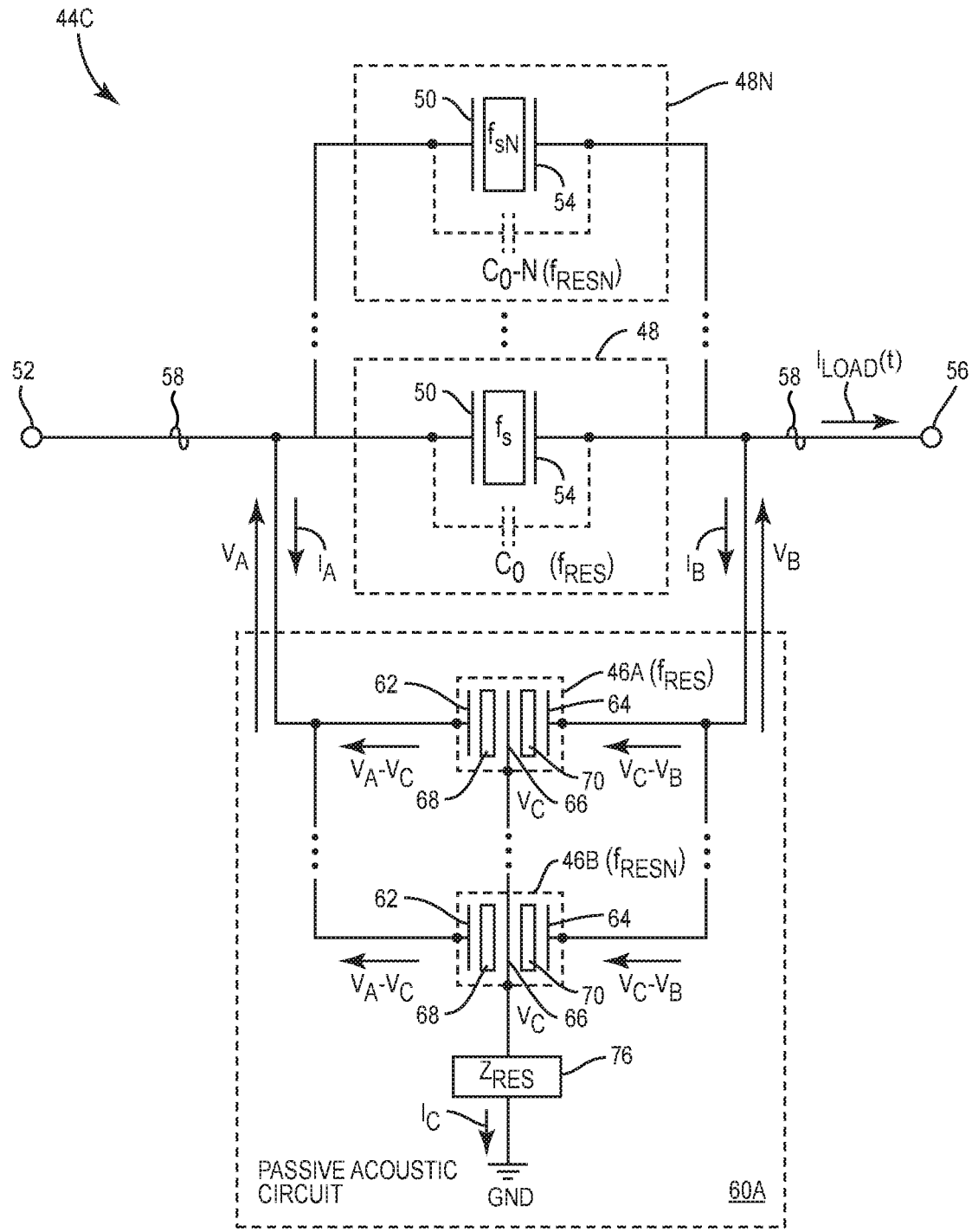
FIG. 6 is a schematic diagram of an exemplary acoustic resonator structure configured according to an embodiment of the present disclosure to cancel more than one electrical capacitance caused by more than one acoustic resonator.

FIG. 6 is a schematic diagram of an exemplary acoustic resonator structure 44C configured according to an embodiment of the present disclosure to cancel more than one electrical capacitance $C_0$ caused by more than one acoustic resonator. Common elements between FIGS. 4, 5, and 6 are shown therein with common element numbers and will not be re-described herein.

The acoustic resonator structure 44C includes the acoustic resonator 48 and the second acoustic resonator 48N in FIG. 5. The acoustic resonator structure 44C also includes the passive acoustic circuit 60A of FIG. 4. The first acoustic structure 46A is configured to resonate in the second frequency ($f_{RES}$) and the second acoustic structure 46B is configured to resonate in the third frequency ($f_{RESN}$). Accordingly, the passive acoustic circuit 60A may effectively cancel the electrical capacitance $C_0$ in the second frequency ($f_{RES}$) and the second electrical capacitance $C_0$-N in the third frequency ($f_{RESN}$).

Those skilled in the art will recognize improvements and modifications to the embodiments of the present disclosure. All such improvements and modifications are considered within the scope of the concepts disclosed herein and the claims that follow.

What is claimed is:

1. An acoustic resonator structure comprising:
   an input node and an output node;
   an acoustic resonator coupled between the input node and the output node and configured to resonate in a first frequency to pass a radio frequency (RF) signal from the input node to the output node, the acoustic resonator causes an electrical capacitance between the input node and the output node at a second frequency different from the first frequency; and
   a passive acoustic circuit coupled in parallel to the acoustic resonator, wherein the passive acoustic circuit comprises an acoustic structure having a first electrode coupled to the input node and a second electrode coupled to the output node and the acoustic structure is configured to resonate in the second frequency to cancel the electrical capacitance.

2. The acoustic resonator structure of claim 1 wherein:
   the acoustic structure further comprises:
      a third electrode provided between the first electrode and the second electrode;
      a first piezo layer provided between the first electrode and the third electrode; and
      a second piezo layer provided between the second electrode and the third electrode; and
   the passive acoustic circuit further comprises an impedance structure coupled to the third electrode and a ground.

3. The acoustic resonator structure of claim 2 wherein the acoustic structure is configured to resonate in the second frequency to cause the electrical capacitance to be canceled.

4. The acoustic resonator structure of claim 2 wherein the impedance structure is configured to provide a shunt impedance substantially equal to one-quarter of an inherent impedance of the acoustic resonator.

5. The acoustic resonator structure of claim 4 wherein the impedance structure comprises at least one capacitor coupled to the third electrode and the ground, the at least one capacitor is configured to provide the shunt impedance substantially equals one-quarter of the inherent impedance of the acoustic resonator.

6. The acoustic resonator structure of claim 4 wherein the impedance structure comprises at least one inductor coupled to the third electrode and the ground, wherein the at least one inductor is configured to provide the shunt impedance substantially equal to one-quarter of the inherent impedance of the acoustic resonator.

7. The acoustic resonator structure of claim 4 wherein the impedance structure comprises at least one capacitor and at least one inductor coupled to the third electrode and the ground, wherein the at least one capacitor and the at least one inductor are configured to provide the shunt impedance substantially equal to one-quarter of the inherent impedance of the acoustic resonator.

8. The acoustic resonator structure of claim 2 wherein:
   the first electrode, the first piezo layer, and the third electrode are configured to form a polarized bulk acoustic wave (BAW) resonator; and
   the second electrode, the second piezo layer, and the third electrode are configured to form a polarized inverted BAW resonator.

9. The acoustic resonator structure of claim 2 wherein the acoustic structure comprises:
   the first electrode, the first piezo layer, and the third electrode configured to form a polarized inverted bulk acoustic wave (BAW) resonator; and
   the second electrode, the second piezo layer, and the third electrode configured to form a polarized BAW resonator.

10. The acoustic resonator structure of claim 2 wherein:
    the acoustic structure is configured to resonate in a second resonance frequency to cause the electrical capacitance to be canceled; and
    the impedance structure is configured to provide a shunt impedance substantially equal to one-quarter of an inherent impedance of the acoustic resonator.

11. The acoustic resonator structure of claim 10 wherein:
    the acoustic structure is further configured to resonate in the second frequency to output a shunt voltage via the third electrode; and
    the impedance structure is further configured to induce a shunt current based on the shunt voltage.

12. The acoustic resonator structure of claim 11 wherein a first voltage differential between the first electrode and the third electrode substantially equals a second voltage differential between the third electrode and the second electrode.

13. The acoustic resonator structure of claim 12 wherein:
    the first voltage differential is configured to cause a first current flowing toward the first electrode;
    the second voltage differential is configured to cause a second current flowing toward the second electrode; and
    the shunt current is configured to substantially equal a sum of the first current and the second current.

14. The acoustic resonator structure of claim 1 wherein the passive acoustic circuit is further configured to resonate in at least one third frequency different from the first frequency and the second frequency to cancel the electrical capacitance.

15. The acoustic resonator structure of claim 14 wherein the passive acoustic circuit further comprises:
    at least one second acoustic structure coupled in parallel to the acoustic resonator and the acoustic structure; and
    an impedance structure coupled to the acoustic structure, the at least one second acoustic structure, and a ground.

16. The acoustic resonator structure of claim 15 wherein the at least one second acoustic structure is configured to resonate in the at least one third frequency to cause the electrical capacitance to be canceled in the at least one third frequency.

17. The acoustic resonator structure of claim 16 wherein the impedance structure is configured to provide a shunt impedance substantially equal to one-quarter of an inherent impedance of the acoustic resonator.

18. The acoustic resonator structure of claim 1 further comprising:
- at least one second acoustic resonator coupled between the input node and the output node, the at least one second acoustic resonator causing at least one second electrical capacitance between the input node and the output node in at least one third frequency different from the first frequency and the second frequency; and
- the passive acoustic circuit is further configured to resonate in the at least one third frequency to cancel the electrical capacitance.

19. The acoustic resonator structure of claim 18 wherein the passive acoustic circuit further comprises:
- at least one second acoustic structure coupled in parallel to the acoustic resonator and the acoustic structure; and
- an impedance structure coupled to the acoustic structure, the at least one second acoustic structure, and a ground.

20. The acoustic resonator structure of claim 19 wherein the at least one second acoustic structure is configured to
- resonate in the at least one third frequency to cause the electrical capacitance to be canceled in the at least one third frequency.

\* \* \* \* \*

UNITED STATES PATENT AND TRADEMARK OFFICE
CERTIFICATE OF CORRECTION

PATENT NO. : 11,431,316 B2
APPLICATION NO. : 16/356279
DATED : August 30, 2022
INVENTOR(S) : Nadim Khlat It is certified that error appears in the above-identified patent and that said Letters Patent is hereby corrected as shown below:

In the Specification

Column 5, Line 64, Eq. 5.2, replace "$I_{LOAD}(V_A-V_B)/Z_S-(V_A+V_B)/(4*Z_{RES})$" with --$I_{LOAD}(t)=(V_A-V_B)/Z_S-(V_A+V_B)/(4*Z_{RES})$--.

Signed and Sealed this
Thirty-first Day of January, 2023

Katherine Kelly Vidal
*Director of the United States Patent and Trademark Office*